(12) United States Patent
Noble

(10) Patent No.: US 6,472,263 B2
(45) Date of Patent: Oct. 29, 2002

(54) NEGATIVE RESISTANCE MEMORY CELL AND METHOD

(75) Inventor: Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/819,259

(22) Filed: Mar. 27, 2001

(65) Prior Publication Data

US 2001/0015907 A1 Aug. 23, 2001

Related U.S. Application Data

(62) Division of application No. 09/281,197, filed on Mar. 30, 1999, now Pat. No. 6,208,555.

(51) Int. Cl.[7] .......................................... H01L 21/8234
(52) U.S. Cl. ..................................... 438/237; 438/153
(58) Field of Search ............................... 438/237, 153, 438/393, 394, 395, 243–249, 386–392; 257/301, 102, 105, 369

(56) References Cited

U.S. PATENT DOCUMENTS

| | | | |
|---|---|---|---|
| 4,573,143 A | 2/1986 | Matsukawa | 365/175 |
| 5,032,891 A | 7/1991 | Takagi et al. | 257/350 |
| 5,214,603 A | 5/1993 | Dhong et al. | 365/207 |
| 5,390,145 A | 2/1995 | Nakasha et al. | 365/159 |
| 5,438,539 A | 8/1995 | Mori | 365/159 |
| 5,587,944 A | 12/1996 | Shen et al. | 365/175 |
| 5,594,683 A | 1/1997 | Chen et al. | 365/177 |
| 5,825,687 A | 10/1998 | Yin | 365/175 |
| 5,936,265 A | 8/1999 | Koga | 357/105 |
| 6,294,412 B1 * | 9/2001 | Krivokapic | 438/155 |
| 6,316,305 B1 * | 11/2001 | Noble | 438/237 |
| 6,342,718 B1 * | 1/2002 | Noble | 257/369 |

FOREIGN PATENT DOCUMENTS

EP 0 720 221 A1 7/1996

OTHER PUBLICATIONS

Jack Y.–C. Sun, "CMOS Technology for 1.8V and Beyond", 1997 International Symposium on VLSI Technology, Systems and Applications, Digest of Technical Papers, pp. 293–297.

S.D. Malaviya, "Single–Device DC Table Memory Cell", IBM Technical Disclosure Bulletin, 20, No. 9, Feb. 1978.

Koji Sakui et al., "A New Static Memory Cell Based on Reverse Base Current (RBC) Effect of Bipolar Transistor", 1998 IEDM, Digest of Technical Papers, pp. 44–47.

J.P.A. van der Wagt et al., "RTD/HFET Low Standby Power SRAM Gain Cell", IEEE Electron Device Letters, 19, No. 1. Jan. 1998, pp. 7–9.

R.A. Logan et al., "Electron Bombardment Damage in Silicon Esaki Diodes", Journal of Applied Physics, 32, No. 7, Jul. 1961, pp. 1201–1206.

D. Chin and H. Matino, "Static RAM Cell Configuration", IBM Technical Disclosure Bulletin, 28, No. 12, May 1986.

Sophie Verdonckt–Vanderbroek et al., "High–Gain Lateral Bipolar Action in a MOSFET Structure", IEEE Transactions on Electron Devices, vol. 38., No. 11, Nov. 1991.

* cited by examiner

Primary Examiner—David Nelms
Assistant Examiner—Gene N. Auduong
(74) Attorney, Agent, or Firm—Dorsey & Whitney LLP

(57) ABSTRACT

A SRAM memory cell including two tunnel diodes coupled in series and a MOS FET. first of the tunnel diodes may be formed in a shallow trench. A second of the tunnel diodes may be formed in a source or drain contact region of the FET. The FET acts as a pass gate to allow data to be read from or written to the memory cell when the gate of the FET is biased to turn the FET ON. The FET otherwise acts to prevent the datum stored in the memory cell from being altered when the FET is turned OFF. The memory cell may be formed to be unusually compact and has a reduced power supply requirements compared to conventional SRAM memory cells. As a result, a compact and robust SRAM having reduced standby power requirements is realized.

16 Claims, 11 Drawing Sheets

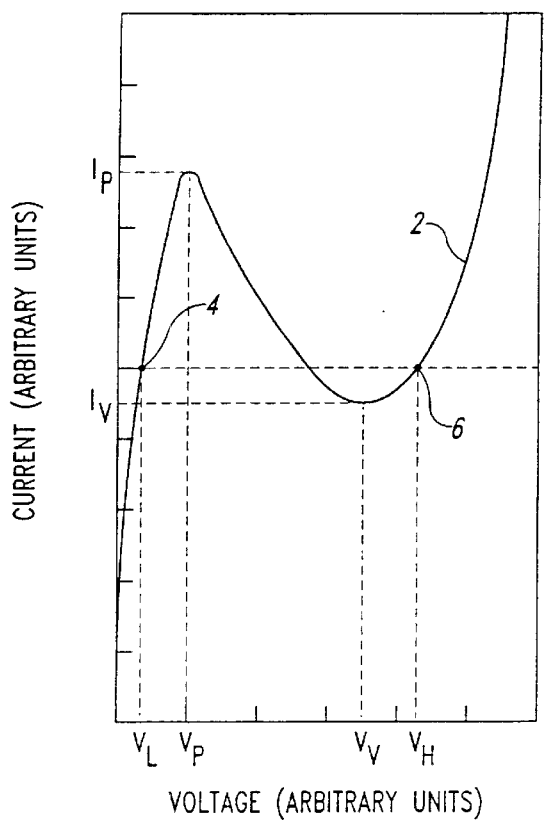
Fig. 1
(Prior Art)
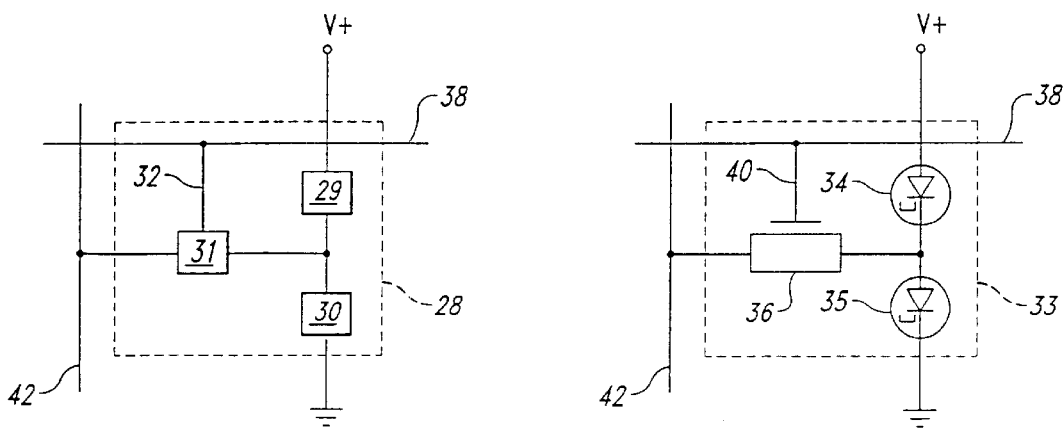
Fig. 4A
(Prior Art)
Fig. 4B
(Prior Art)

NEGATIVE RESISTANCE MEMORY CELL AND METHOD

CROSS-REFERENCE TO RELATED APPLICATION

This application is a divisional of pending U.S. patent application No. 09/281,197, filed Mar. 30, 1999 now U.S. Pat. No. 6,208,555.

TECHNICAL FIELD

The present invention relates in general to memory circuits and in particular to improved static random access memory cells.

BACKGROUND OF THE INVENTION

Random access memory ("RAM") cell densities have increased dramatically with each generation of new designs and have served as one of the principal technology drivers for ultra large scale integration ("ULSI") in integrated circuit ("IC") manufacturing. The area required for each memory cell in a memory array partially determines the capacity of a memory IC. This area is a function of the number of elements in each memory cell and the size of each of the elements. State-of-the-art memory cells for gigabit memory ICs have cell areas approaching $6F^2$, where F represents a minimum feature size for photolithographically-defined features. Static RAM ("SRAM") densities, while increasing less dramatically than densities for dynamic RAM ("DRAM") technologies, have nevertheless also increased substantially.

A traditional six-device SRAM cell contains a pair of crosscoupled inverters, forming a latch circuit having two stable states. The minimum memory cell size attainable for this type of SRAM is approximately $120F^2$, as described in "CMOS Technology for 1.8V and Beyond," by Jack Y. C. Sun, 1997 Int. Symp. On VLSI Tech., Syst. And Apps., Digest of Tech. Papers, pp. 293–297. Forming SRAM cells using vertical transistors allows memory cell sizes to be reduced to $32F^2$, because FETs having source and drain vertically aligned may be formed to be smaller than planar FETs. Achieving further size reduction requires a new mechanism of memory cell operation. For example, tunnel diodes can provide a memory function.

FIG. 1 shows an example of a current-voltage characteristic curve 2 for a two-terminal device exhibiting so-called "N-type" negative differential resistance, where the name is derived from the resemblance of the shape of the I-V curve to the shape of the letter "N." In FIG. 1, negative differential resistance exists over a voltage range delimited on one side by a peak having a peak current $I_p$ at a peak voltage $V_p$ and delimited on the other side by a valley having a valley current $I_v$ and a valley voltage $V_v$.

Negative differential resistance phenomena are able to provide memory functions because devices exhibiting them allow either of two different, stable voltages to result in the same current through the device, e.g., voltages $V_L$ and $V_H$ at respective points 4 and 6 on the curve 2. Devices exhibiting "S-type" negative differential resistance (also named in accordance with the shape of the shape of the I-V curve) can also provide a memory function, but with two different, stable current levels being possible for a given voltage.

Base current reversal in bipolar transistors also can permit data storage. Base current reversal results when impact ionization occurring at a p-n junction between a base and a collector in the transistor generates enough minority carriers to cancel or exceed majority carrier injection from an emitter to the base. The base terminal then displays two or more stable states that do not source or sink current, and the transistor may be used to store information represented by the state of the base terminal. FIG. 2 is a graph showing a simplified current-voltage characteristic for a storage device employing base current reversal, in accordance with the prior art.

A first stable state, at a point denoted "A," where no current passes through the base terminal corresponds to a base voltage of zero volts. As base voltage is increased from zero volts, base current is initially increased also, as shown in a first portion of a current-voltage characteristic 8 (to the left of a point marked "B"). As the base voltage increases further, the number of electrons injected into the base and then diffusing into a depleted portion of the collector increases. These electrons are accelerated through the depleted portion of the collector. At the point marked "B" on the first portion 8 of the base-emitter current-voltage characteristic, holes that are created through impact ionization in the collector region and that are swept into the base begin to outnumber electrons injected from the emitter in forming a base terminal current $I_B$. As base-emitter voltage further increases, the number of holes created by impact ionization also increases (dashed portion of trace 8) until the net base terminal current $I_B$ becomes zero at the point marked "C" in FIG. 2, at a base emitter voltage of slightly less than 0.6 volts. This portion 8 of the current-voltage characteristic corresponds to a base current flowing in a direction normally associated with a base current for a NPN bipolar transistor.

A second portion 10 of the current-voltage characteristic corresponds to base current flowing in the opposite of the direction illustrated in the first portion 8. The second portion 10 corresponds to holes being created by impact ionization at the collector-base junction of the transistor, where the holes collected by the base outnumber electrons emitted from the emitter and collected by the base. The base current becomes increasingly negative until the point marked "D" on the curve 10. At the point marked "D," electrons injected into the base from the emitter begin to dominate the base terminal current $I_B$, and the base terminal current $I_B$ again becomes very small (dashed trace).

The base terminal current $I_B$ again becomes zero at a point marked "E" in FIG. 2, corresponding to a base-emitter voltage of about 0.9 volts. As base-emitter voltage is increased even further, a third portion 12 of the current-voltage characteristic corresponds to a base terminal current $I_B$ flowing in the same direction as the first portion 8. The base terminal current $I_B$ then behaves conventionally with further increases in base emitter voltage.

At the points "A," "C" and "E," the net base terminal current $I_B$ is zero. Significantly, the transistor is stable at these points. As a result, opening a switch coupled to the base results in the transistor staying at one of these points and allowing a state of the transistor to be determined by measuring the baseemitter voltage, (i.e., a "read" of the data stored in the transistor).

U.S. Pat. No. 5,594,683, entitled "SRAM Memory Cell Using A CMOS-Compatible High Gain Gated Lateral BJT", issued to M. J. Chen and T. S.

Huang, describes a memory employing base current reversal for data storage.

FIG. 3 is a simplified schematic diagram of a generic memory cell 14 formed from a storage device 16 and an access element 18, in accordance with the prior art. The storage device 16 is represented as a NPN bipolar transistor in FIG. 3, however, the storage device 16 may be formed from a structure corresponding to a NMOS FET and may be capable of operating as either an NPN transistor or a NMOS FET, as described in "High-Gain Lateral Bipolar Action in a MOSFET Structure" by S. Verdonckt–Vandebroek et al., IEEE Trans. El. Dev., Vol. 38, No. 11, Nov. 1991, pp. 2487–2496.

The memory cell 14 is read by turning the access element 18 ON through application of a suitable signal to a word line driver 20. A sense amplifier (not shown in FIG. 3) is coupled to the storage device 16 through a bit line 24 and the access element 18.

Data can be written to the storage device 16 by applying a write pulse to a control electrode of a bit line switch 22 and also turning ON the access element 18 as described above. The data bit to be written to the storage device 16 is coupled through the bit line switch 22 to a control electrode of the storage device 16. The access element 18 is then turned OFF, electrically isolating the storage device 16 from the bit line 24 and storing the data bit in the memory cell 14. Compact memory cells 14 drawing as little as 1 nanoampere of standby current can be designed using this approach. However, the memory cell described in U.S. Pat. No. 5,594,683 requires an area of at least $8F^2$.

Compact memory cells drawing as little as I nanoampere of standby current can be designed using this approach. Additionally, since the base current reversal mechanism requires impact ionization within the base-collector junction, voltages generally in excess of 4 volts must be applied across the memory cell for successful operation. As a result, standby power requirements are still several nanowatts per memory cell.

Tunnel diodes have also been employed to provide negative differential resistance for SRAM cell operation. U.S. Pat. No. 5,390,145, entitled "Resonance Tunnel Diode Memory", issued to Nakasha et al., describes a memory cell using pairs of GaAs tunnel diodes coupled in series and providing memory cells having an area of about $30F^2$. "RTD-HFET Low Standby Power SRAM Gain Cell", IEEE El. Dev. Lett., Vol. 19, No. 1(January 1998), pp. 7–9, by J. P. A. van der Wagt et al. describes successful operation of memory cells using III–V semiconductor resonant tunnel diodes and separate read and write devices. However, GaAs devices are expensive to manufacture.

Silicon tunnel diode memories have been demonstrated where the tunnel diode draws about one nanoampere and is coupled in series with a depletion mode load device. These memories use a single read/write device, as in a conventional one-device DRAM cell. However, depletion mode load devices again require several volts to be applied across the memory cell for successful operation. As a result, several nanowatts of standby power per memory cell are still required.

There is therefore a need for a compact and robust memory cell having reduced standby power draw requirements.

SUMMARY OF THE INVENTION

In one aspect, the present invention includes a memory cell. The memory cell is formed on a silicon substrate and includes a first negative resistance device having a first electrode coupled to a first reference voltage. A second negative resistance device has a first electrode coupled to a node that is coupled to a second electrode of the first negative resistance device and a second electrode coupled to a second reference voltage. The memory cell also includes a switching element having a control electrode coupled to a first selection line, a first current-carrying electrode coupled to the node and a second current-carrying electrode coupled to a second selection line. The negative resistance devices are able to store one of two states while drawing less than a nanoampere from a power supply of less than one volt, and are extremely compact. As a result, a very low power, high density SRAM memory cell is realized.

In another aspect, the present invention includes a method of operating a memory device. The method includes coupling a first voltage to a gate of a MOS FET that is part of a memory cell to turn the MOS FET ON. The method also includes sensing a voltage at a node that is coupled to an anode of a first tunnel diode, a cathode of a second tunnel diode and a first current-carrying electrode of the MOS FET. The voltage represents data stored in the memory cell. The present invention further permits application of a voltage to the node to set the node to one of two stable states to store data in the memory cell. The method also permits coupling a second voltage to the gate of the MOS FET that is part of the memory cell to turn the MOS FET OFF.

BRIEF DESCRIPTION OF THE DRAWINGS

FIG. 1 is a graph showing a simplified current-voltage characteristic for a two-terminal device having N-type negative differential resistance, in accordance with the prior art.

FIG. 4A is a simplified schematic diagram of a generic memory cell formed from two negative resistance devices and a transistor, in accordance with the prior art.

FIG. 4B is a simplified schematic diagram of a generic memory cell formed from two tunnel diodes and a transistor, in accordance with the prior art.

DETAILED DESCRIPTION OF THE INVENTION

Figure 2:
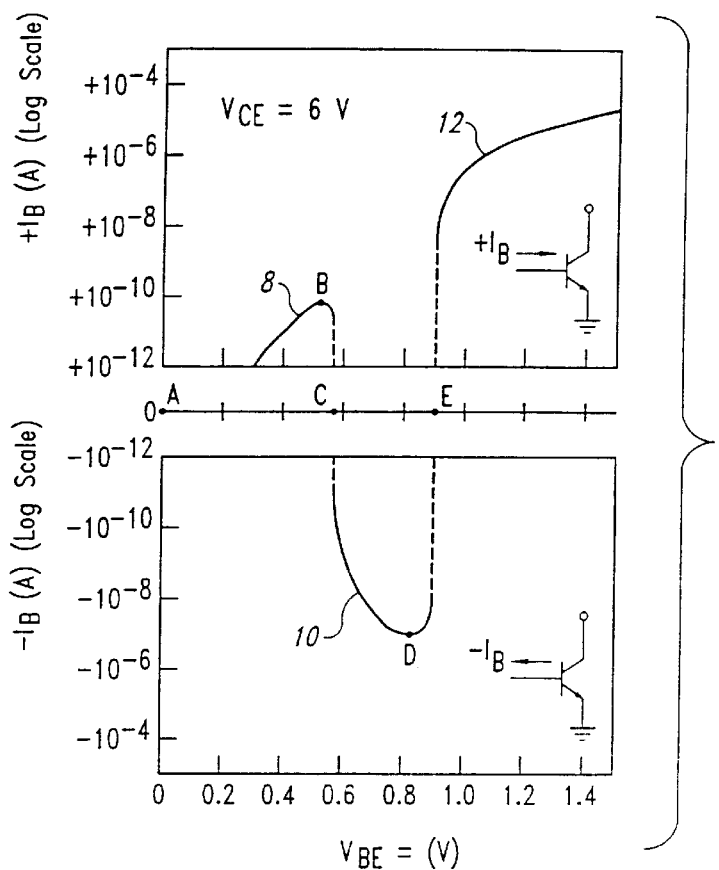
FIG. 2 is a graph showing a simplified current-voltage characteristic for a storage device, in accordance with the prior art.

FIG. 4A is a simplified schematic diagram of a generic memory cell 28 formed from two negative resistance devices 29 and 30 and a transistor 31 having a control electrode 32, in accordance with the prior art. The negative resistance devices 29 and 30 are coupled in series with a constant voltage V+ having a magnitude that is equal to the sum of $V_L$ and $V_H$ as shown in FIG. 1. As a result, the voltage across one of the negative resistance devices 29 or 30 can be $V_L$ while the voltage across the other is $V_H$. The memory cell 28 therefore has two different, stable states. Turning the transistor 31 ON by applying a suitable voltage to the control terminal 32 allows the state of the memory cell 28 to be read. Turning the transistor 31 ON while a suitable voltage, such as either $V_L$ or $V_H$ is coupled to a bitline 42, allows the voltage stored in the memory cell 28 to be changed. Turning the transistor 31 OFF by applying a suitable voltage to the control terminal 32 allows the state of the memory cell 28 to be stored.

FIG. 4B is a simplified schematic diagram of a generic memory cell 33 that includes two tunnel diodes 34 and 35 that form the negative resistance devices 29 and 30 of FIG. 4A, in accordance with the prior art of the present invention. A FET 36 forms the transistor 31. The tunnel diode 35 has a cathode that is coupled to a first reference voltage, represented as ground in FIG. 4B, and has an anode that is coupled to a current-carrying electrode of the FET 36. The tunnel diode 34 has a cathode that is coupled to the anode of the first tunnel diode 34 and has an anode that is coupled to the power supply V+. Design criteria and operational characteristics of tunnel diodes such as the tunnel diodes 34 and 35 are generally discussed in "Physics of Semiconductor Devices" (second edition) by Simon Sze (John Wiley and Sons, 1981), as are transistors such as the FET 36. The tunnel diodes 34 and 35 have negative resistance characteristics, as shown in FIG. 1. The memory cell 33 thus operates in the same manner as explained above with respect to FIG. 4A.

In one embodiment, the tunnel diodes 34 and 35 are formed from silicon and exhibit a peak current $I_p$ at a peak voltage $V_p$ of about a tenth of a volt (the magnitude of the peak current $I_p$ is proportional to the active area of the p+-n+ junction of the tunnel diode 34 or 35). In this embodiment, the tunnel diodes 34 and 35 exhibit a valley current $I_v$ at a valley voltage $V_v$ of about 0.32 volts. By setting the voltage V+ to be about 0.42 volts, the voltage across the tunnel "tec" diodes 34 and 35 will be stable when $V_H$ is roughly 0.4 volts and $V_L$ is about 0.02 volts. When the voltage V+ is less than one volt, and the current through the tunnel diodes 34 and 35 is less than a nanoampere, each memory cell 33 draws less than a nanowatt in a standby state.

Figure 5:
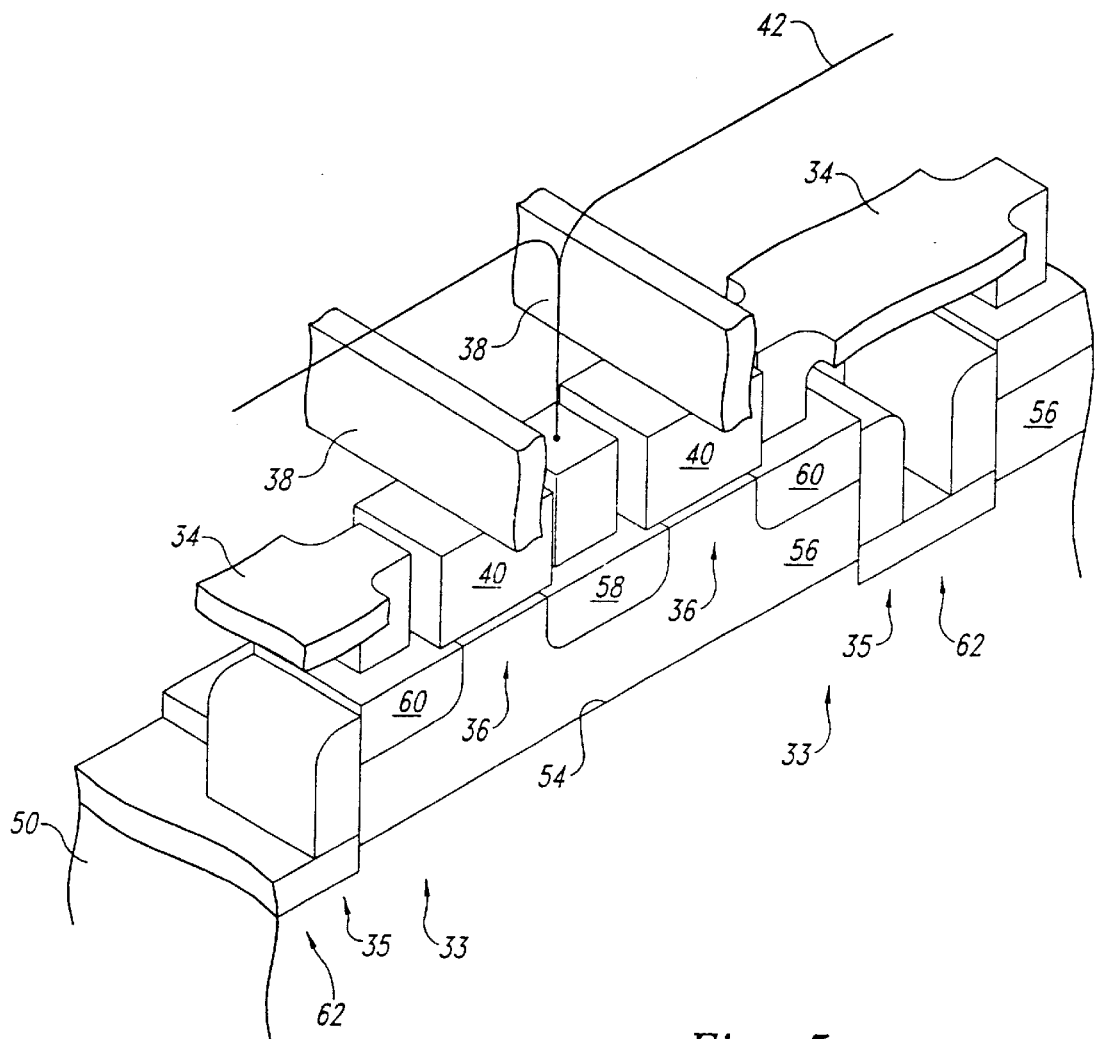
FIG. 5 is a simplified isometric view, shown in partial cutaway, of an embodiment of a pair of the memory cells of FIG. 4B, in accordance with an embodiment of the present invention.

FIG. 5 is a simplified isometric view, shown in partial cutaway, of an embodiment of a pair of the memory cells 33 of FIG. 4B coupled to the same bit line 42, in accordance with an embodiment of the present invention. The memory cells 33 are thus in the same column of an array of memory cells 33. In one embodiment, the memory cells 33 are fabricated on a silicon substrate 50, as described below in conjunction with FIGS. 7–17.

In one embodiment, the substrate 50 may be a p-type silicon substrate. In another embodiment, the substrate 50 may be a p+ substrate having a p-type surface 54 that may be formed from an epitaxial layer. In another embodiment, the substrate 50 may be an insulating substrate having a p-type surface 54. In any case, a plurality of n-type regions 56 are formed on the p-type surface 54 of the substrate 50. In one embodiment, the n-type regions 56 are formed by conventional masking, ion implantation and anneal.

Each of the memory cells 33 also includes the FET 36 with the gate 40 coupled to different word lines 38 and a source or drain 58 coupled to a common bitline 42. A drain or source 60 of each FET 36 has one of the tunnel diodes 34 fabricated within it and the other tunnel diode 35 is formed within a shallow trench 62 that additionally serves to isolate memory cells 33 in one direction. Detailed descriptions of an embodiment of the FET 36 and the tunnel diodes 34 and 35 are provided below.

Figure 6:
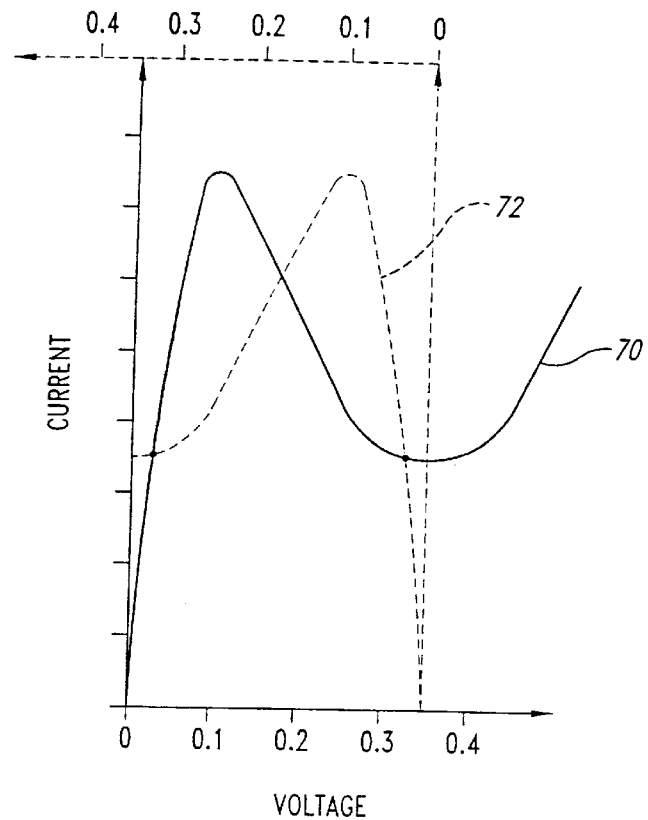
FIG. 6 is a graph showing simplified current-voltage characteristics for the memory cell of FIG. 5, in accordance with an embodiment of the present invention.

FIG. 6 is a graph showing simplified current-voltage characteristics 70 and 72 for the tunnel diodes 34 and 35 of the memory cell 33 of FIGS. 4B and 5, in accordance with an embodiment of the present invention. The tunnell diode 34 corresponds to the curve 70 (solid trace and abscissa), while the tunnel diode 35 corresponds to the curve 72 (dashed trace and abscissa). Intersections between the two traces 70 and 72 correspond to the two stable states of the memory cell 33.

Figure 7:
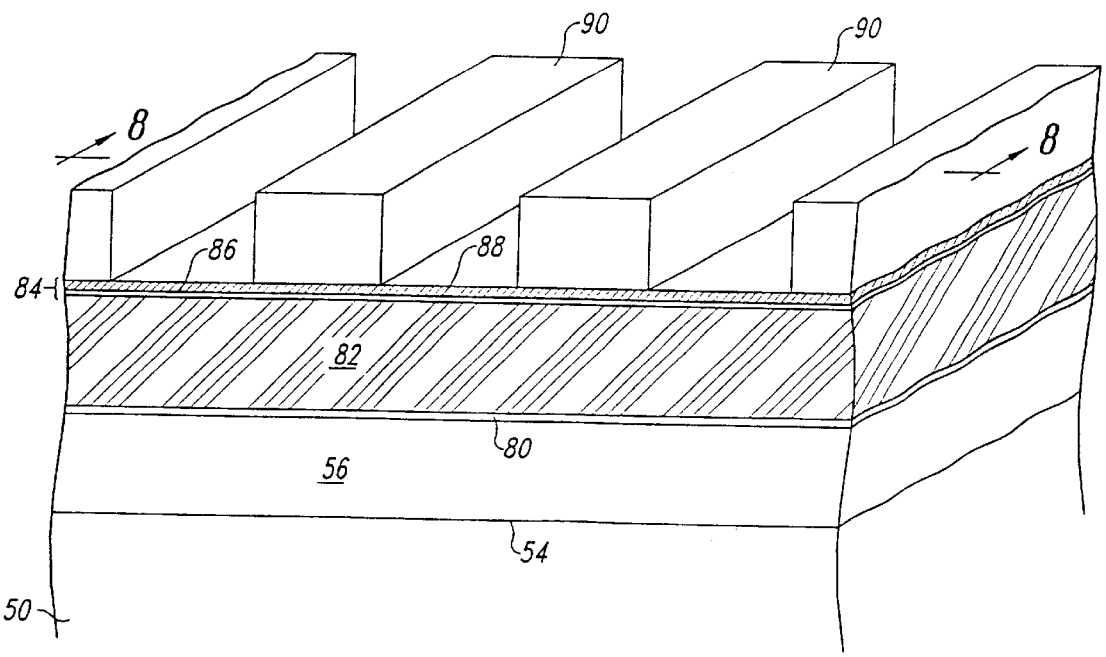
FIG. 7 is a simplified isometric view of a semiconductor substrate that can be processed to form the memory cell of FIG. 5, in accordance with an embodiment of the present invention.

FIG. 7 is a simplified isometric view of a semiconductor substrate 50 that can be processed to form the memory cell 33 of FIG. 5, in accordance with an embodiment of the present invention. Many of the components used in the embodiments of FIGS. 7–17 are identical to components used in the embodiment of the memory cell 33 of FIG. 5. Therefore, in the interest of brevity, these components have been provided with the same reference numerals, and an explanation of them will not be repeated.

The substrate 50 is implanted or has an epitaxial layer grown to provide the n-type regions 56 on the p-type surface 54. A thin dielectric layer 80 is formed on the n-type regions 56. In one embodiment, the thin dielectric layer 80 is formed by a conventional thermal oxide layer.

A conductive layer 82 is formed on the thin dielectric layer 80. In one embodiment, the conductive layer 82 is formed from p+ polycrystalline silicon to have a thickness of about 700 nanometers. A masking layer 84 is formed on the conductive layer 82. In one embodiment, the masking layer 84 is formed from a thin conventional thermal oxide layer 86 and a silicon nitride layer 88, which may be about 100 nanometers thick. Silicon nitride layers 88 may be formed using conventional chemical vapor deposition ("CVD") techniques.

A photoresist layer (not shown) is formed on the masking layer 84 and is exposed to provide photoresist stripes 90. The photoresist stripes 90 are then used to selectively remove exposed portions of the masking layer 84 to expose stripes of the conductive layer 82. The photoresist stripes 90 are then conventionally removed.

Figure 8:
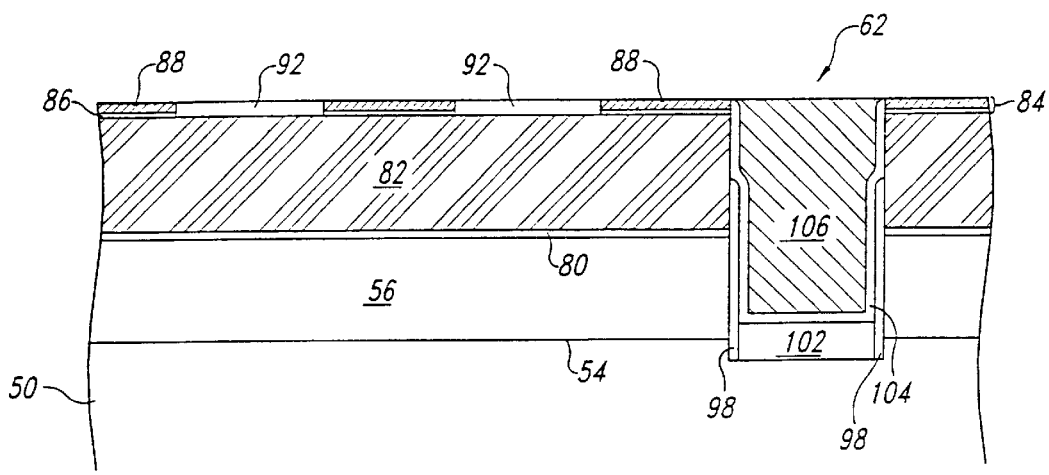
FIG. 8 is a simplified cross-sectional view, taken along the line 6—6 of FIG. 7, at a later point in processing, in accordance with an embodiment of the present invention.

FIG. 8 is a simplified side view of the substrate 50 of FIG. 7 at a later point in processing, in accordance with an embodiment of the present invention. A layer of material 92 is formed on the exposed stripes of the conductive. layer 82 and on the silicon nitride layer 88 portion of the masking layer 84. The material 92 is then planarized using conventional chemical-mechanical polishing to remove the material 92 from the masking layer 84, thereby leaving stripes of the material 92 on the conductive layer 82. In one embodiment, the material 92 is an oxide formed in a layer by a conventional CVD process, e.g., TEOS.

Another photoresist layer (not shown) is formed on the stripes of the masking layer 84 and material 92, and is processed to provide openings above areas that will become the trenches 62. An anisotropic etching process is used to etch the trenches 62. In one embodiment, the trenches 62 are etched to a depth of about one-half micron.

Although not shown in FIG. 8, a thin (e.g., 10–20 nanometer) dielectric layer 98 is then formed on all surfaces of the trench 62. In one embodiment, the thin dielectric layer is an oxide-nitride or an oxide-nitride-oxide layer deposited by a conventional isotropic CVD process. A conventional anisotropic etching process is then used to remove the thin dielectric layer from all surfaces except sidewalls of the trench 62, as shown in FIG. 8.

Heavily doped regions 102 are then created at the bottom of the trenches 62. In one embodiment, the heavily doped regions 102 are formed by conventional ion implantation. In another embodiment, the heavily doped regions 102 are formed by epitaxial growth. In one embodiment, the heavily doped regions 102 are p+ regions.

A thin dielectric layer 104 is then formed, for example, by conventional CVD of a thin oxide layer. In one embodiment, a polycrystalline silicon layer is then formed by conventional CVD techniques and is conventionally chemical-mechanical polished to form a plug of polycrystalline silicon 106 that fills the trenches 62 and provides a planar surface.

Figure 9:
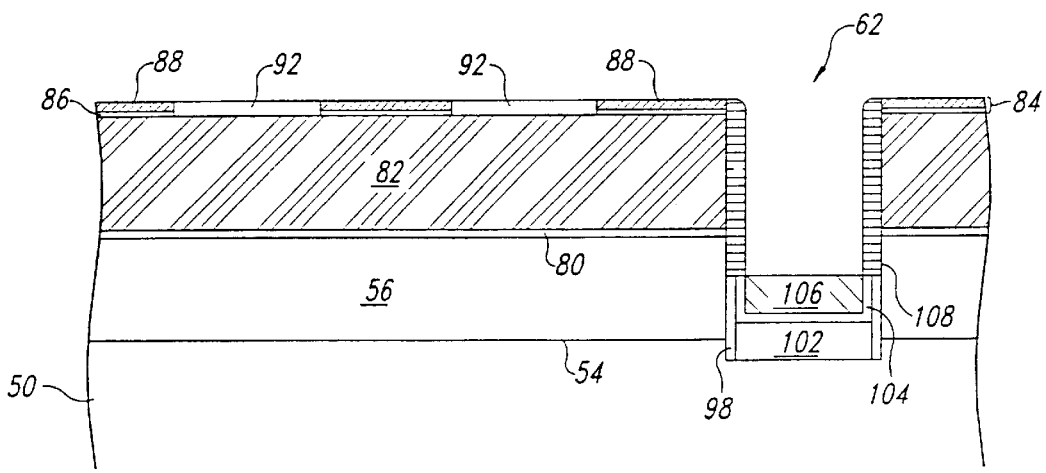
FIG. 9 is a simplified cross-sectional view of the substrate of FIG. 8 at a later point in processing, in accordance with an embodiment of the present invention.

FIG. 9 is a simplified side view of the substrate 50 of FIG. 8 at a later point in processing, in accordance with an embodiment of the present invention. An etching process is used to recess the polycrystalline silicon 106 below a surface of the substrate 50. In one embodiment, the polycrystalline silicon plug 106 is recessed about 0.2 micron below the surface of the n-type region 56.

The dielectric layers 98 and 104 are stripped from the sidewalls above the polycrystalline silicon 106, for example, by a timed dip etching process, and a conductive layer 108 is formed by an isotropic process (e.g., CVD) that coats all surfaces of the trench 62. In one embodiment, the conductive layer 108 is formed from tungsten having a thickness of 10–20 nanometers. An anisotropic etching process is then used to remove the conductive layer 108 from the bottom, but not the sidewalls of the trench 62 so that the substrate 50 is as shown in FIG. 9.

Figure 10:
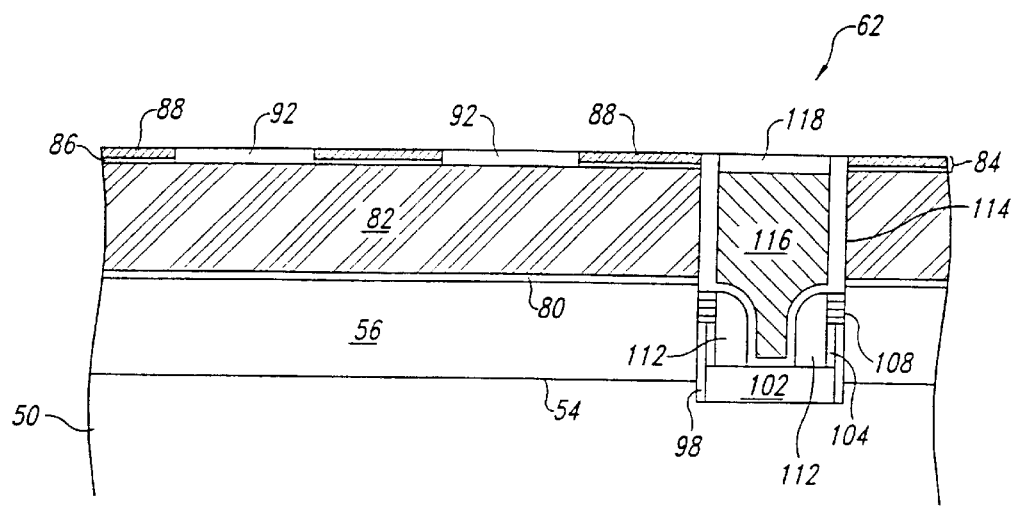
FIG. 10 is a simplified cross-sectional view of the substrate of FIG. 9 at a later point in processing, in accordance with an embodiment of the present invention.

FIG. 10 is a simplified side view of the substrate 50 of FIG. 9 at a later point in processing, in accordance with an embodiment of the present invention. The plug of polycrystalline silicon 106 of FIGS. 8 and 9 is selectively removed from the trench 62 using conventional etching processes, and a directional etch is used to remove the dielectric layer from the bottoms, but not the sidewalls, of the trenches 62.

A pair of n+ silicon regions 112 are then formed as explained below. First, an n+ polycrystalline silicon layer (not illustrated) is deposited to a thickness of less than or up to ⅓ of a minimum lithographic dimension. The minimum lithographic dimension is also known as a "critical dimension" or CD. An anisotropic etch is then used to remove the n+ polycrystalline silicon layer from all surfaces except the sidewalls of the trenches 62, resulting in the n+ silicon regions 112 formed on the p+ silicon 102 and contacting the conductive layer 108 on the sidewalls of the trenches 62. An isotropic etching process is then used to remove exposed portions of the conductive layer 108 from the sidewalls of the trenches 62.

A thin dielectric layer 114 is then formed using an isotropic process. In one embodiment, the thin dielectric layer 114 is a silicon dioxide layer formed to have a thickness of 10–20 nanometers by conventional CVD techniques (e.g., TEOS).

The trenches 62 are then filled with polycrystalline silicon 116 and the substrate 50 is again planarized using conventional chemical-mechanical polishing. In one embodiment, the polycrystalline silicon 116 is formed as intrinsic (i.e., undoped) polycrystalline silicon. Exposed surfaces of the polycrystalline silicon 116 is then conventionally thermally oxidized to provide a dielectric layer 118, resulting in the structure shown in FIG. 10.

Figure 11:
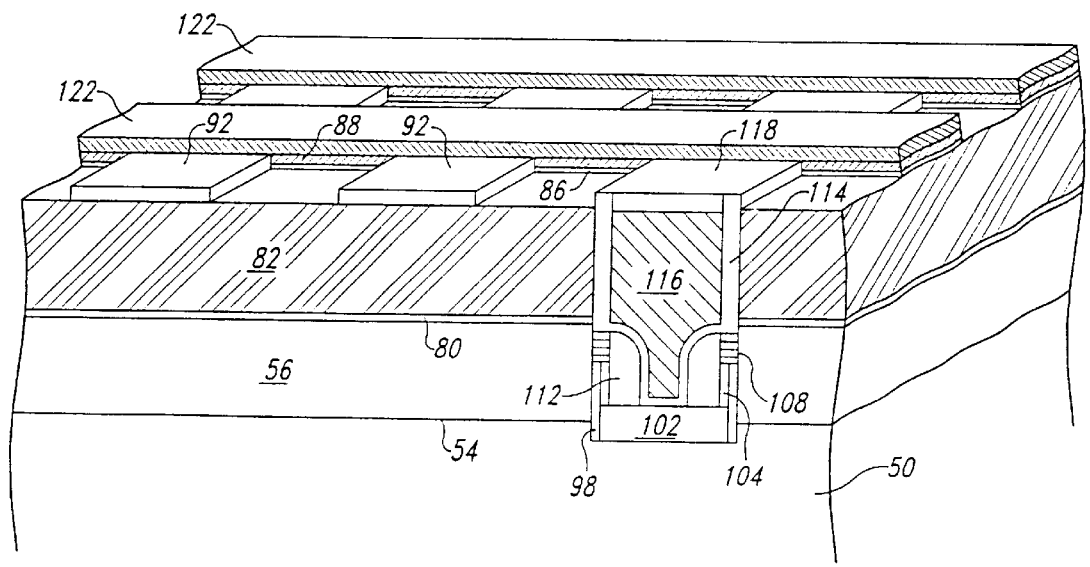
FIG. 11 is a simplified isometric view of the substrate of FIG. 10 at a later point in processing, in accordance with an embodiment of the present invention.

FIG. 11 is a simplified isometric view of the substrate 50 of FIG. 10 at a later point in processing, in accordance with an embodiment of the present invention. In this processing step, a pair of dielectric stripes are formed, and the mask layer 84 exposed between the stripes is removed. Another dielectric layer (not illustrated) is formed on the stripes of the mask layer 84 and material 92. In one embodiment, the dielectric layer is a silicon nitride layer formed by conventional CVD to have a thickness of about 50 nanometers. A photoresist layer is formed and patterned to provide photoresist stripes (not illustrated) that are orthogonal to the stripes of the mask layer 84, material 92 and the dielectric layer 118. All of the exposed portions of the dielectric layers 88 are then selectively etched to remove the mask layer 84, but not the material 92 or the dielectric layer 118. The photoresist stripes are stripped to provide dielectric strips 122 illustrated in FIG. 11.

Figure 12:
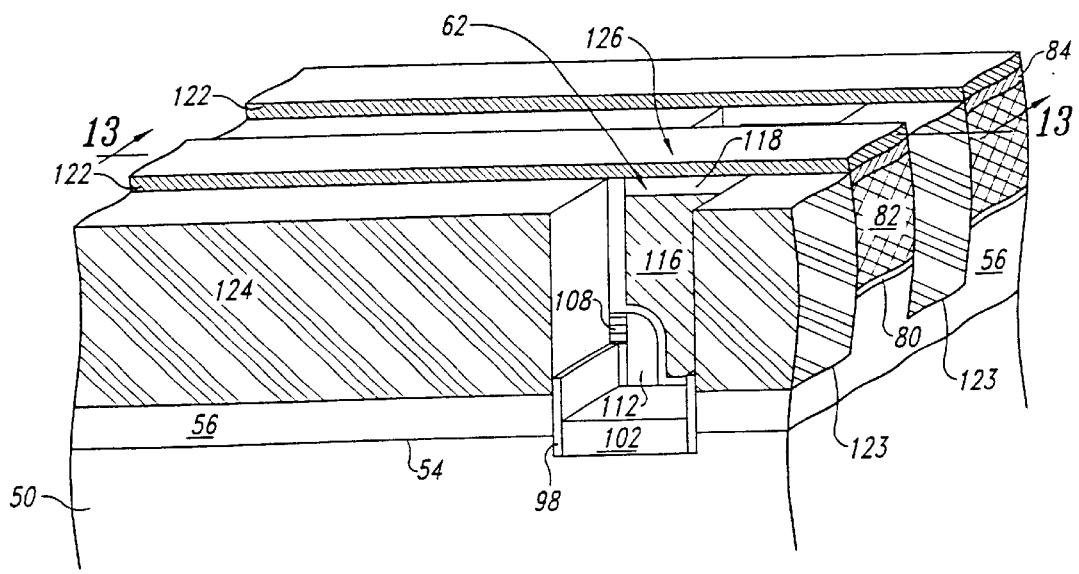
FIG. 12 is a simplified isometric view of the substrate of FIG. 11 at a later point in processing, in accordance with an embodiment of the present invention.

FIG. 12 is a simplified isometric view of the substrate 50 of FIG. 11 at a later point in processing, in accordance with an embodiment of the present invention. A layer of photoresist (not illustrated) is applied and is patterned to cover only the trench 62. The exposed portions of the dielectric layer 92 are then etched and the photoresist layer is stripped. An anisotropic etch removes exposed portions of the polycrystalline silicon 82 (not shown in FIG. 12) and etches into the n-type regions 56 to form isolation trenches 123.

The substrate 50 is then coated with another dielectric layer 124 and is again chemical-mechanical polished to planarize the substrate 50. Exposed portions of the dielectric layer 118 formed on the polycrystalline silicon 116 are etched and the polycrystalline silicon 116, thin dielectric layer 114 and n+ polycrystalline silicon 112 are selectively and anisotroprically etched, stopping on the heavily doped region 102. This provides openings 126 and results in the structure illustrated in FIG. 12.

Figure 13:
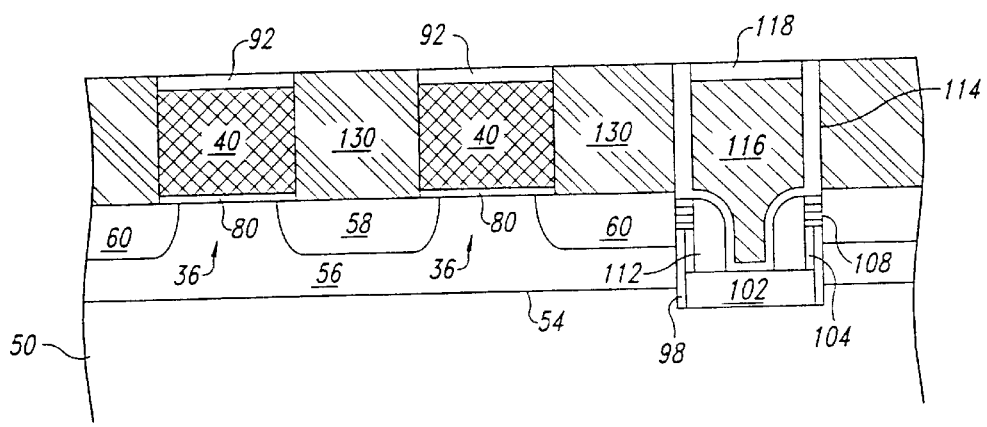
FIG. 13 is a simplified cross-sectional view of the substrate of FIG. 12 at a later point in processing, in accordance with an embodiment of the present invention.

FIG. 13 is a simplified cross-sectional view of the substrate 50 of FIG. 12 at a later point in processing, in accordance with an embodiment of the present invention. A layer of undoped polycrystalline silicon (not illustrated) is formed, for example using CVD, and is conventionally planarized using chemical-mechanical polishing, to provide polycrystalline silicon plugs (not illustrated) in the openings 126 separating tunnel diodes formed from the heavily doped layers 102 and the n+ polycrystalline silicon 112.

The polycrystalline silicon plugs are thermally oxidized to provide a dielectric layer (not illustrated) 60–100 nanometers thick at a top surface of the polycrystalline silicon plugs. All exposed portions of the dielectric layers 122 and 88 are then removed. In one embodiment where the dielectric layers 122 and 88 are formed from silicon nitride, they are selectively removed using a phosphoric acid etch.

The polycrystalline silicon layer 82 is then anisotropically etched in the areas where it is not covered by the dielectric layer 92 to expose the n-type regions 56. These exposed regions 56 are then implanted with ions to form the p+ source/drain areas 58 and 60. An undoped polycrystalline silicon layer is applied, for example using CVD, and is planarized using conventional chemical-mechanical polishing, to provide plugs of polycrystalline silicon 130 over the source and drain areas 58 and 60, resulting in the structure illustrated in FIG. 13.

Figure 14:
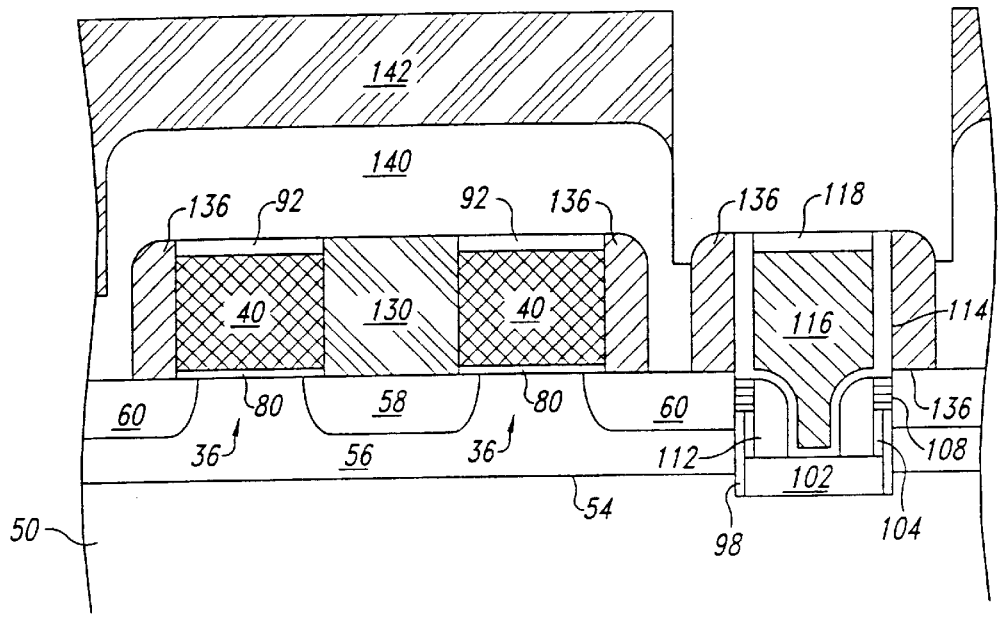
FIG. 14 is a simplified cross-sectional view of the substrate of FIG. 13 at a later point in processing, in accordance with an embodiment of the present invention.

FIG. 14 is a simplified cross-sectional view of the substrate 50 of FIG. 13 at a later point in processing, in accordance with an embodiment of the present invention. A photoresist layer (not illustrated) is applied and patterned to expose areas above the drain areas 60. The plugs of polycrystalline silicon 130 formed above the drain areas 60 are then selectively etched to expose the drain areas 60.

A dielectric layer (not illustrated) is then formed to have a thickness of less than or up to ⅓ of the critical dimension. In one embodiment, this dielectric layer is a silicon nitride layer formed by CVD. The dielectric layer is then directionally etched to provide dielectric spacers 136 on one sidewall of the gate material 40 and on a facing sidewall of the polycrystalline silicon 116 in the trenches: 62.

A n+ polycrystalline silicon layer 140 is then deposited. Photoresist is applied and is patterned to provide a mask 142. Exposed portions of the n+ polycrystalline silicon layer 140 are then etched for a time sufficient to expose the top dielectric layer 118 but not long enough to remove the n+ polycrystalline silicon 140 from the spaces between the dielectric spacers 136, providing the structure illustrated in FIG. 14.

Figure 15:
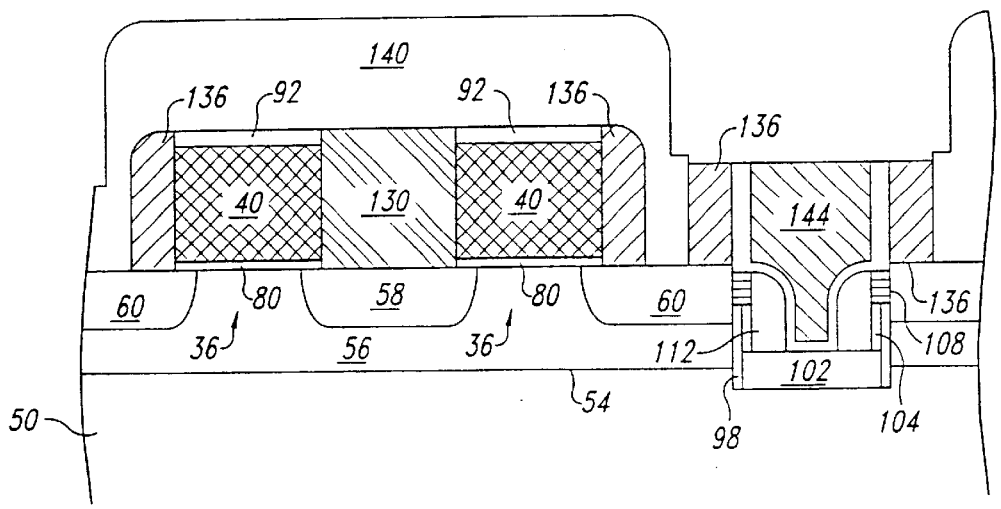
FIG. 15 is a simplified cross-sectional view of the substrate of FIG. 14 at a later point in processing, in accordance with an embodiment of the present invention.

FIG. 15 is a simplified cross-sectional view of the substrate 50 of FIG. 14 at a later point in processing, in accordance with an embodiment of the present invention. The top dielectric layer 118 on the polycrystalline silicon 116 is selectively removed and a top portion of the polycrystalline silicon 116 that was implanted with p+ dopants when the source and drain areas 58 and 60 were implanted is etched. A selective etch that etches intrinsic (undoped) polycrystalline silicon is used to remove the rest of the polycrystalline silicon 116 from the trenches 62.

A dielectric layer 144 is then deposited over the entire substrate 50 and is etched back, filling the trenches 62 as shown in FIG. 15. In one embodiment, the dielectric layer 144 is deposited to a thickness such that it becomes relatively planar. An isotropic timed etch then provides the structure shown in FIG. 15. In another embodiment, the dielectric layer 144 is chemical-mechanical polished and then is etched to provide the structure shown in FIG. 15.

Figure 16:
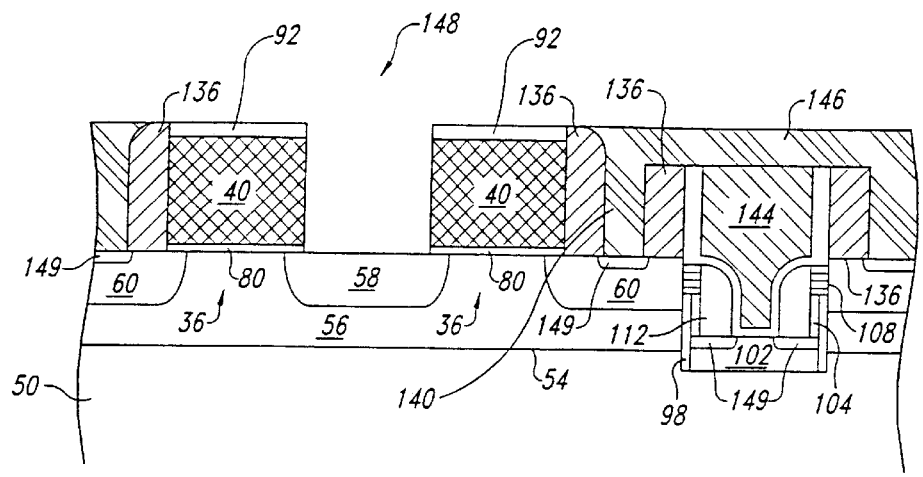
FIG. 16 is a simplified cross-sectional view of the substrate of FIG. 15 At a later point in processing, in accordance with an embodiment of the present invention.

FIG. 16 is a simplified side of the substrate 50 of FIG. 15 at a later point in processing, in accordance with an embodiment of the present invention. A n+ polycrystalline silicon layer 146 is formed and the substrate 50 is again planarized, using, for example, conventional chemical-mechanical polishing. The n+ polycrystalline silicon layer 146 together with the n+ polycrystalline silicon 140 form a continuous conductor across the dielectric layer 144. The undoped polycrystalline silicon 130 (FIG. 15) is then selectively removed, leaving openings 148 above the source regions 58 and providing the structure illustrated in FIG. 16. Annealing processes are employed as needed to activate implanted regions and to diffuse n+ dopants (e.g., phosphorous) from the n+ polycrystalline silicon layer 140 into the p+ drain regions 60, and from the n+ polycrystalline silicon 112 into the heavily doped region 102, to form n+-p+ tunnel diode junctions 149.

Figure 17:
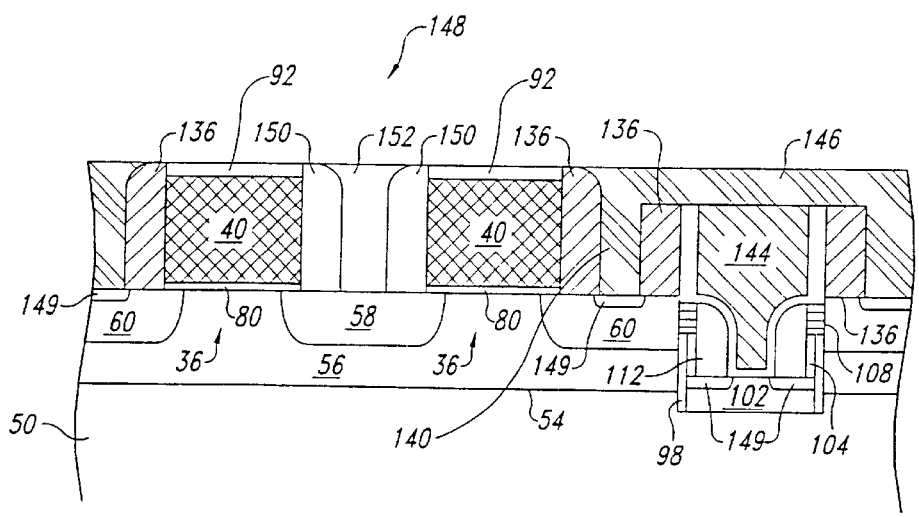
FIG. 17 is a simplified cross-sectional view of the substrate of FIG. 16 at a later point in processing, in accordance with an embodiment of the present invention.

FIG. 17 is a simplified cross-sectional view of the substrate 50 of FIG. 16 at a later point in processing, in accordance with an embodiment of the present invention. A dielectric layer (not illustrated) having a thickness of up to about ⅓ of the critical dimension is formed on and is etched using an anisotropic etching process to leave an insulating liner 150 formed on the sidewalls of openings 148 where the undoped polycrystalline silicon 130 was removed.

A conductive layer (not illustrated) is then formed on structures formed on the substrate 50 and in the openings 148. In one embodiment, the conductive layer is formed from p+ polycrystalline silicon. A conventional chemical-mechanical polish then planarizes structures formed on the substrate 50 and forms bitline contact studs 152.

Bitlines 42 (see FIGS. 4 and 5) and wordlines 38 are then formed, for example, using techniques described in U.S. Pat. No. 5,214,603, entitled "Folded Bitline, Ultra-High Density Dynamic Random Access Memory Having Access Transistors Stacked Above Trench Storage Capacitors" and issued to S. H. Dhong et al. and in European Patent Application No. EP 0 720 221 A 1, entitled "High Density Trench Capacitor DRAM Cell" and issued to W. P. Noble, Jr.

Figure 18:
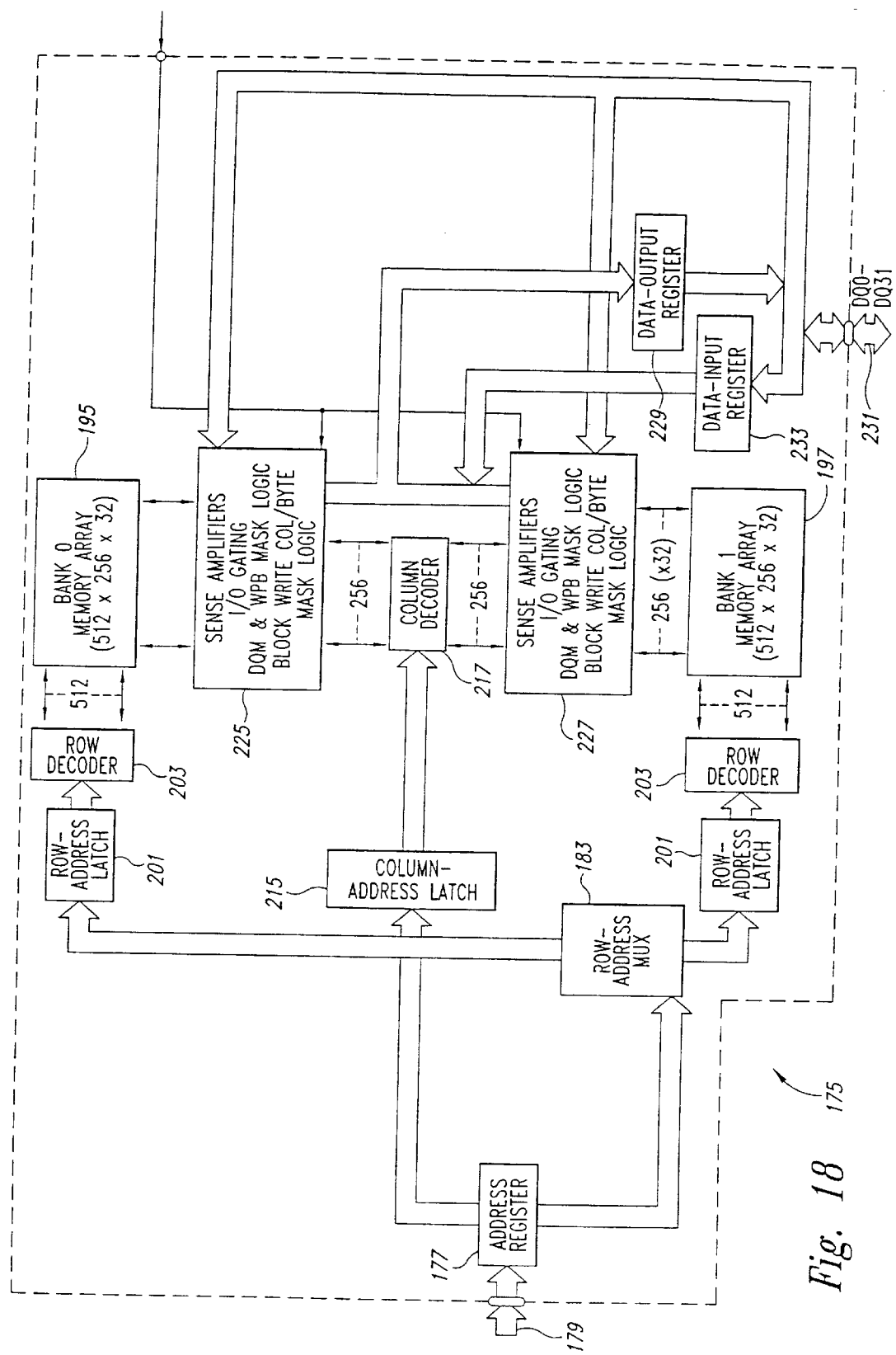
FIG. 18 is a simplified block diagram of a memory device that can be formed using the memory cells of FIGS. 4B and 5, in accordance with an embodiment of the present invention.

FIG. 18 is a simplified block diagram of an SRAM 175 that can be formed using the memory cells 33 of FIGS. 4B and 5, in accordance with an embodiment of the present invention. The SRAM 175 includes an address register 177 )that receives either a row address or a column address on an address bus 179. The address bus 179 is generally coupled to a memory controller (not shown in FIG. 18). Typically, a row address is initially received by the address register 177 and is applied to a row address multiplexer 183. The row address multiplexer 183 couples the row address to a number of components associated with either of two memory banks 195, 197 depending upon the state of a bank address bit forming part of the row address. Associated with each of the memory banks 195, 197 is a respective row address latch 201 which stores the row address, and a row decoder 203 which applies various signals to its respective memory bank 195 or 197 as a function of the stored row address.

After the row address has been applied to the address register 177 and stored in one of the row address latches 201, a column address is applied to the address register 177. The address register 177 couples the column address to a column address latch 215. The column address from the column address latch 215 is decoded by a column address decoder 217 to address a specific column or columns. The row address corresponds to one or more of the word lines 38 of FIG. 3, and the column address corresponds to one or more of the bit lines 42.

Data to be read from one of the memory banks 195, 197 is coupled to the column circuitry 225, 227 for one of the memory banks 195, 197, respectively. The data is then coupled to a data output register 229 which applies the data to a data bus 231. Data to be written to one of the memory banks 195, 197 is coupled from the data bus 231 through a data input register 233 to the column circuitry 225, 227 and then is transferred to one of the memory banks 195,197, respectively.

Figure 19:
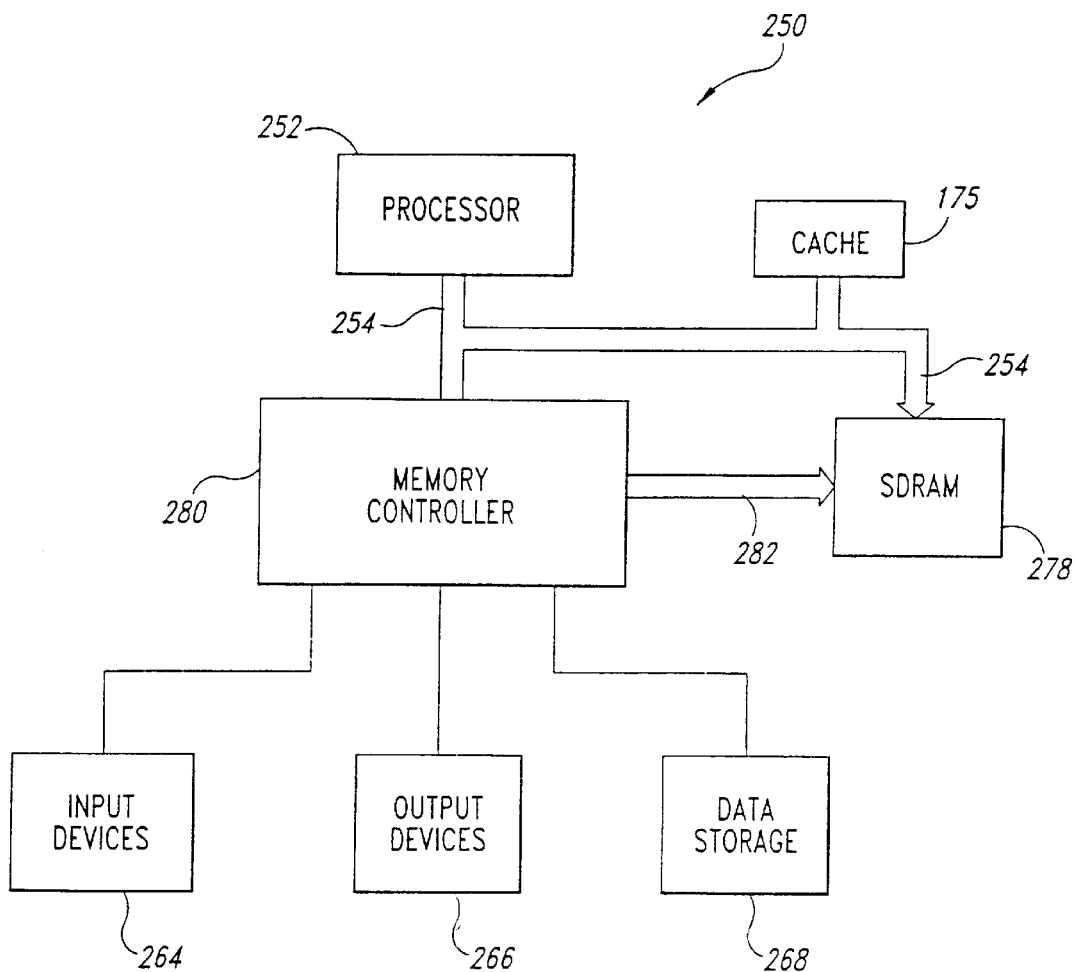
FIG. 19 is a simplified block diagram of a computer system including one or more memories using the memory device FIG. 18, in accordance with an embodiment of the present invention.

FIG. 19 is a simplified block diagram of a computer system 250 including one or more memories using the SRAM 175 of FIG. 18, in accordance with an embodiment of the present invention. The computer system 250 includes a processor 252 for performing various computing functions, such as executing specific software to perform specific calculations or tasks. The processor 252 includes a processor bus 254 that normally includes an address bus, a control bus, and a data bus.

In addition, the computer system 250 includes one or more input devices 264, such as a keyboard or a mouse, coupled to the processor 252 to allow an operator to interface with the computer system 250. Typically, the computer system 250 also includes one or more output devices 266 coupled to the processor 252, such output devices typically being a printer or a video terminal. One or more data storage devices 268 are also typically coupled to the processor 252 to allow the processor 252 to store data or retrieve data from internal or external storage media (not shown). Examples of typical storage devices 268 include hard and floppy disks, tape cassettes and compact disk readonly memories (CD-ROMs).

The processor 252 is also typically coupled to cache memory 175, which is usually SRAM 175, by a processor bus 254 and to DRAM 278 through a memory controller 280. The memory controller 280 normally includes a control and address bus 282 that is coupled to the DRAM.

When incorporated into the computer system 250, the SRAM memory 175 of the present invention provides increased data density, high access speed and reduced power consumption. These advantages are particularly useful in the context of handheld or portable products.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming a memory cell in a substrate, comprising:

forming an active region in the substrate;

forming a trench in the substrate to isolate the active regions;

forming in the active region a switch having a source/drain region;

forming a first negative resistance device in the trench coupled to the source/drain region; and forming a second negative resistance device in the source/drain region.

2. The method of claim 1 wherein forming the switch comprises forming the source/drain region abutting the trench.

3. The method of claim 2 wherein forming the first negative resistance device comprises forming a conductive region along the sidewall of the trench to couple the first negative resistance device to the abutting source/drain region.

4. The method of claim 1 wherein forming the switch comprises forming a PMOS transistor.

5. The method of claim 1 wherein forming first and second negative resistance devices comprise forming tunnel diodes.

6. A method for forming a memory cell in a substrate, comprising:

forming a trench in the substrate;

forming a first negative resistance device in the trench
   forming a switch having a source/drain region formed in the substrate, the source/drain region abutting the trench and coupled to the first negative resistance device; and forming a second negative resistance device in the source/drain region.

7. The method of claim 6 wherein forming the first negative resistance device comprises forming a conductive region along a sidewall of the trench to couple the first negative resistance device to the abutting source/drain region.

8. The method of claim 6 wherein forming the switch comprises forming a PMOS transistor.

9. The method of claim 6 wherein forming first and second negative resistance devices comprise forming tunnel diodes.

10. The method of claim 6 wherein the substrate comprises an n-type epitaxial layer.

11. A method for forming a negative resistance memory in a silicon substrate, comprising:

forming a shallow trench in the silicon substrate;

forming a first negative resistance device in the shallow trench, the first negative resistance device having first and second electrodes, the first electrode being coupled to a first reference voltage;

forming a second negative resistance device in the silicon substrate, the second negative resistance device having a first electrode coupled to a second reference voltage and a second electrode coupled to the second electrode of the first negative resistance device; and forming a switching element on the silicon substrate, the switching element having a control electrode coupled to a first selection line, a first current-carrying electrode coupled to the second electrodes of the first and second negative resistance devices, and a second current-carrying electrode coupled to a second selection line.

12. The method of claim 11 wherein forming the switching element on the silicon substrate comprises forming a MOS FET.

13. The method of claim 11 wherein the substrate includes a p-type surface layer and forming the switching element comprises:

forming a region of n-type silicon in the p-type surface layer;

forming a first p+ silicon region in the n-type region;

forming a second p+ region in the n-type region and spaced apart from the first p+ region;

forming a gate oxide extending from the first p+ region to the second p+ region; and forming a gate formed on the gate oxide.

14. The method of claim 13 wherein forming the first negative resistance device in the shallow trench comprises forming a tunnel diode in the shallow trench adjacent the first p+ region and forming a conductor formed on a sidewall of the shallow trench to electrically couple the tunnel diode and the first p+ region, and wherein forming the second negative resistance device comprises forming a tunnel diode formed within the first p+ region.

15. The method of claim 11 wherein forming the first and second negative resistance devices comprises forming tunnel diodes.

16. The method of claim 11 wherein forming the switching element comprises forming a MOS FET, forming the first negative resistance device comprises forming a tunnel diode in a shallow trench adjacent the MOS FET, and forming the second negative resistance device comprises forming a tunnel diode in a source or drain of the MOS FET.

* * * * *

UNITED STATES PATENT AND TRADEMARK OFFICE
CERTIFICATE OF CORRECTION

PATENT NO. : 6,472,263 B2
DATED : October 29, 2002
INVENTOR(S) : Wendell P. Noble It is certified that error appears in the above-identified patent and that said Letters Patent is hereby corrected as shown below:

Title page,
Item [56], OTHER PUBLICATIONS,
"R.A. Logan et al.," reference "1998 IEDM" should read -- 1988 IEDM --
Item [57], ABSTRACT,
Line 39, "MOS FET. first" should read -- MOS FET. A first --
Line 48, "requirements" should read -- requirement --

Column 1,
Line 37, "Symp. On VLSI" should read -- Symp. on VLSI --

Figure 3:
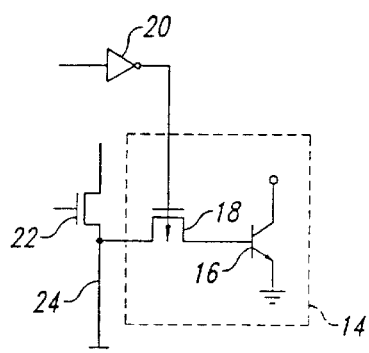
FIG. 3 is a simplified schematic diagram of a generic memory cell formed. from a storage device and an access element, in accordance with the prior art.

Column 2,
Line 58, "baseemitter" should read -- base-emitter --
Line 61, "Using A CMOS-" should read -- Using a CMOS- --
Lines 62-63, "and T.S.          should read     -- and T.S. Huang, Huang, describes"                               describes --
Line 64-65, "data storage.       should read    -- data storage. FIG. 3 --
           FIG. 3"

Column 3,
Line 26, "little as I nanoampere" should read -- little as 1 nanoampere --
Line 41, "No. 1(January 1998)," should read -- No. 1 (January 1998), --

Column 4,
Line 32, "cell formed. from" should read -- cell formed from --

Column 5,
Line 12, "FIG. 15 At" should read -- FIG. 15 at --
Line 35, "$V_H$as shown" should read -- $V_H$ as shown --
Line 61, "Sons, 1981), as are" should read -- Sons, 1981), as are --

Column 6,
Line 42, "tunnell diode" should read -- tunnel diode --

Column 7,
Line 14, "conductive. layer" should read -- conductive layer --
Lines 46-47, "chemical-mechanical     should read      -- chemically-
         polished"                                            mechanically polished --

UNITED STATES PATENT AND TRADEMARK OFFICE
CERTIFICATE OF CORRECTION

PATENT NO. : 6,472,263 B2
DATED : October 29, 2002
INVENTOR(S) : Wendell P. Noble It is certified that error appears in the above-identified patent and that said Letters Patent is hereby corrected as shown below:

Column 8,
Line 30, "116 is then" should read -- 116 are then --
Line 60, "chemical-mechical polished" should read -- mechanically polished --
Line 65, "anisotroprically" should read -- anisotropically --

Column 9,
Line 41, "in the trenches: 62." should read -- in the trenches 62. --
Line 66, "chemical-mechanical polished" should read -- chemically-mechanically polished --

Column 10,
Line 45, ")that receives" should read -- that receives --

Column 11,
Line 33, "readonly" should read -- read-only --

Column 12,
Line 14, "in the trench" should read -- in the trench; --

Signed and Sealed this

Ninth Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,472,263 B2
DATED : October 29, 2002
INVENTOR(S) : Wendell P. Noble It is certified that error appears in the above-identified patent and that said Letters Patent is hereby corrected as shown below:

Title page,
Item [56], OTHER PUBLICATIONS,
"Koji Sakui" reference "1998 IEDM" should read -- 1988 IEDM --
Item [57], ABSTRACT,
Line 39, "MOS FET. first" should read -- MOS FET. A first --
Line 48, "requirements" should read -- requirement --

Column 1,
Line 37, "Symp. On VLSI" should read -- Symp. on VLSI --

Column 2,
Line 58, "baseemitter" should read -- base-emitter --
Line 61, "Using A CMOS-" should read -- Using a CMOS- --
Lines 62-63, "and T.S.         should read     -- and T.S. Huang,
         Huang, describes"                           describes --
Line 64-65, "data storage.     should read    -- data storage. FIG. 3 --
         FIG. 3"

Column 3,
Line 26, "little as I nanoampere" should read -- little as 1 nanoampere --
Line 41, "No. 1(January 1998)," should read -- No. 1 (January 1998), --

Column 4,
Line 32, "cell formed. from" should read -- cell formed from --

Column 5,
Line 12, "FIG. 15 At" should read -- FIG. 15 at --
Line 35, "$V_H$as shown" should read -- $V_H$ as shown --
Line 61, "Sons, 1981), as are" should read -- Sons, 1981), as are --

Column 6,
Line 42, "tunnell diode" should read -- tunnel diode --

Column 7,
Line 14, "conductive. layer" should read -- conductive layer --
Lines 46-47, "chemical-mechanical    should read    -- chemically-
         polished"                                        mechanically polished --

UNITED STATES PATENT AND TRADEMARK OFFICE
CERTIFICATE OF CORRECTION

PATENT NO.    : 6,472,263 B2
DATED         : October 29, 2002
INVENTOR(S)   : Wendell P. Noble It is certified that error appears in the above-identified patent and that said Letters Patent is hereby corrected as shown below:

Column 8,
Line 30, "116 is then" should read -- 116 are then --
Line 60, "chemical-mechanical polished" should read -- chemically-mechanically polished --
Line 65, "anisotroprically" should read -- anisotropically --

Column 9,
Line 41, "in the trenches: 62." should read -- in the trenches 62. --
Line 66, "chemical-mechanical polished" should read -- chemically-mechanically polished --

Column 10,
Line 45, ")that receives" should read -- that receives --

Column 11,
Line 33, "readonly" should read -- read-only --

Column 12,
Line 14, "in the trench" should read -- in the trench; --

This certificate supersedes Certificate of Correction issued September 9, 2003.

Signed and Sealed this

Tenth Day of February, 2004

JON W. DUDAS
*Acting Director of the United States Patent and Trademark Office*